United States Patent
Kamae et al.

(10) Patent No.: US 10,734,077 B1
(45) Date of Patent: Aug. 4, 2020

(54) WORD LINE DISCHARGE SKIP FOR FASTER READ TIME

(71) Applicant: SANDISK TECHNOLOGIES LLC, Addison, TX (US)

(72) Inventors: Norihiro Kamae, Yokohama (JP); Yosuke Kato, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/456,029

(22) Filed: Jun. 28, 2019

(51) Int. Cl.
*G11C 16/04* (2006.01)
*G11C 16/08* (2006.01)
*G06F 3/06* (2006.01)
*G11C 16/32* (2006.01)

(52) U.S. Cl.
CPC ............. *G11C 16/08* (2013.01); *G06F 3/061* (2013.01); *G06F 3/064* (2013.01); *G06F 3/0673* (2013.01); *G11C 16/32* (2013.01)

(58) Field of Classification Search
CPC ......... G11C 16/08; G06F 3/061; G06F 3/064; G06F 3/0673
USPC .................................................... 365/185.23
See application file for complete search history.

(56) References Cited

U.S. PATENT DOCUMENTS

| | | | | |
|---|---|---|---|---|
| 5,384,742 A | * | 1/1995 | Miyakawa | G11C 16/10 365/185.13 |
| 7,443,751 B2 | * | 10/2008 | Miller | G11C 7/08 365/205 |
| 2011/0058427 A1 | * | 3/2011 | Choi | G11C 16/3468 365/185.25 |

* cited by examiner

*Primary Examiner* — Vu A Le
(74) *Attorney, Agent, or Firm* — Vierra Magen Marcus LLP

(57) ABSTRACT

Methods for improving read time performance and energy consumption when reading multiple pages within a memory block by dynamically skipping or accelerating unselected word line discharge cycles are described. In some cases, a controller or one or more control circuits in communication with word lines and bit lines associated with a memory block may detect that a read command or instruction for reading a second page within the memory block has arrived prior to the word line discharge phase associated with reading a first page within the memory block, and in response, the controller may skip the discharge cycle for unselected word lines within the memory block prior to reading the second page and initiate the next page read for the second page after a partial discharge period of time.

20 Claims, 13 Drawing Sheets

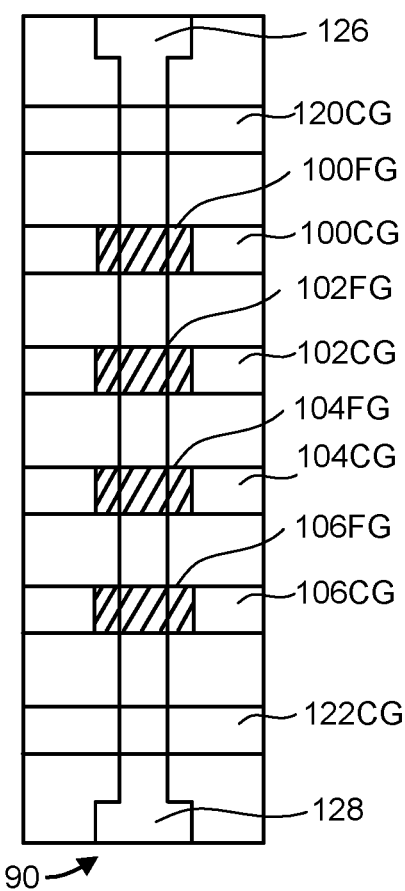 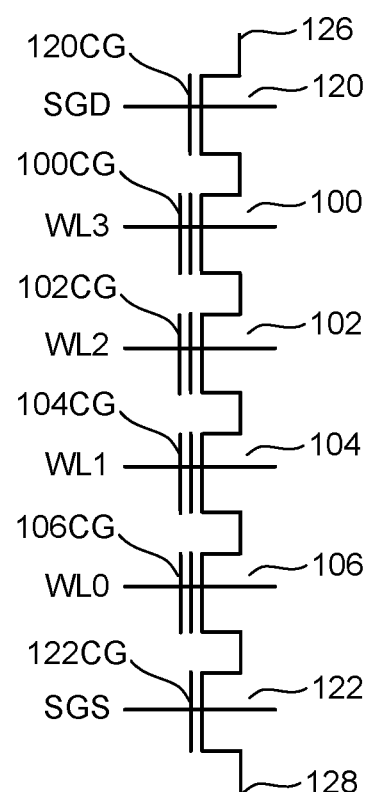
FIG. 1  FIG. 2

First programming pass

Second programming pass

WORD LINE DISCHARGE SKIP FOR FASTER READ TIME

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased word line to word line coupling.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

DETAILED DESCRIPTION

Figure 3A:
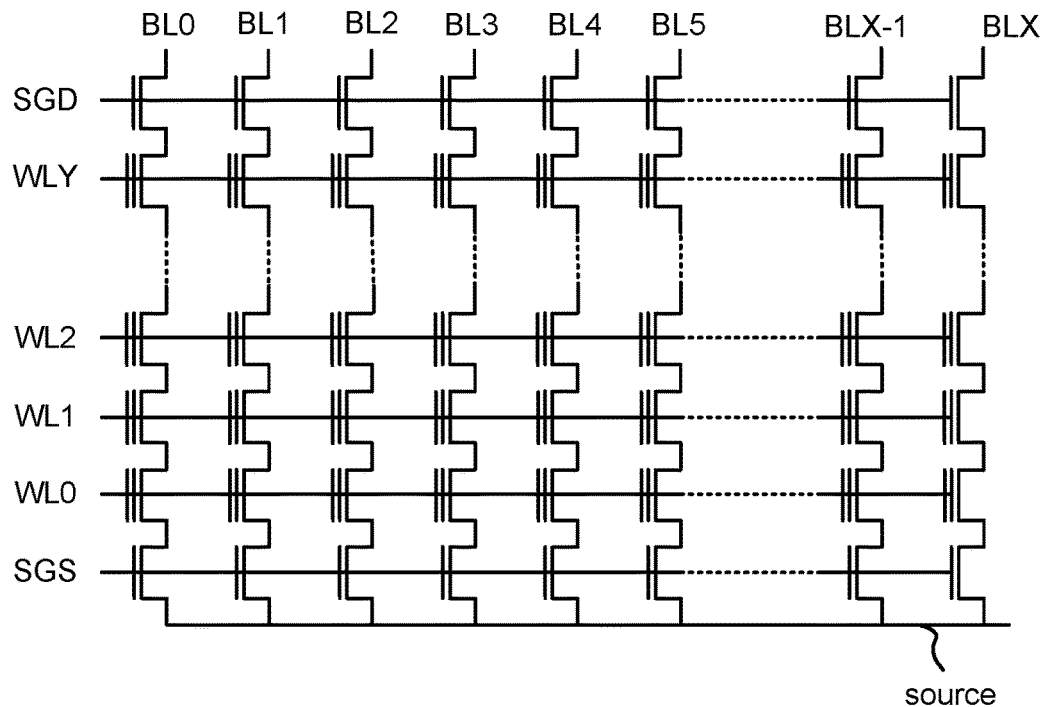
FIG. 3A depicts one embodiment of a memory block including a plurality of NAND strings.

Technology is described for improving read time performance and energy consumption when reading multiple pages within a memory block by dynamically skipping unselected word line discharge cycles and merging Vread spikes and unselected string discharging into a single phase. The memory block may include a plurality of memory cells. The memory block may include a plurality of NAND flash memory structures, such as vertical NAND structures or bit cost scalable (BiCS) NAND structures. In some cases, if a controller (or one or more control circuits) detects that a read command or instruction for reading a second page within a memory block has arrived prior to the word line discharge phase associated with reading a first page within the memory block, then the controller may skip the discharge cycle for unselected word lines within the memory block prior to reading the second page and initiate the next page read for the second page after a partial discharge period of time (e.g., after an accelerated period of time that is less than the amount of time to complete the full discharge cycle for the unselected word lines within the memory block). The controller may compare block addresses and/or word line addresses for the first page read and the second page read in order to identify consecutive page reads within the same memory block.

In some cases, the partial discharge period of time may correspond with the amount of time required to adjust a word line voltage for a selected word line prior to a read operation for the second page (e.g., the next page read) from an unselected word line voltage to a selected word line voltage; in this case, the word line voltage applied to a second word line of the memory block associated with an unselected word line during a read operation for the first page (e.g., the previous page read that was prior to the read operation for the second page) may be adjusted from the unselected word line voltage to the selected word line voltage during the partial discharge period of time. In other cases, the partial discharge period of time may correspond with the amount of time required to adjust a word line voltage for an unselected word line prior to the read operation for the second page from a selected word line voltage to an unselected word line voltage; in this case, the word line voltage applied to a first word line associated with the selected word line during the read operation for the first page may be adjusted from the selected word line voltage to the unselected word line voltage during the partial discharge period of time.

The amount of time between the end of the read operation for the first page and the beginning of the subsequent read operation for the second page may be determined or set based on the selected word line voltage (e.g., VCGRV) applied to the selected word line during the read operation for the first page and/or the unselected word line voltage (e.g., VREAD) applied to one or more unselected word lines during the read operation for the first page. In one embodiment, the partial discharge period of time may be determined based on a voltage difference between the selected word line voltage applied to the selected word line during reading of the first page and the unselected word line voltage applied to one or more unselected word lines during the reading of the first page. In another embodiment, the partial discharge period of time between the ending of the first page read and the beginning of the second page read may be set based on the selected word line voltage applied to the selected word line during the reading of the first page. In another embodiment, the partial discharge period of time between the ending of the first page read and the beginning of the second page read may be set based on the unselected word line voltage applied to one or more unselected word lines during the reading of the first page. In another embodiment, the partial discharge period of time between the ending of the first page read and the beginning of the second page read may be set based on a voltage difference between the unselected word line voltage applied to one or more unselected word lines during the reading of the first page and a selected word line voltage to be applied to a selected word line during the next page reading of the second page.

One technical issue with allowing unselected word lines to fully discharge between consecutive read operations within the same memory block is that it may take several microseconds to stabilize the word line voltage levels prior to performing a subsequent page read. One technical benefit of detecting a read condition in which unselected word line discharge cycles may be skipped or accelerated prior to reading the subsequent page within the memory block is that the overall read performance may be improved, and the overall power and energy consumption may be reduced.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure. In some embodiments, the transistors within a NAND string may comprise transistors with a charge trapping layer.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) may require more die area, an increase in the number of fabrication layers, or an increase in the height of a memory device. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate (or into a charge storage layer, such as a silicon nitride charge trapping layer) via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. In the case of a vertical memory device (e.g., BiCS or other type of 3D NAND), the vertical channel in the memory string may be electrically connected to the substrate (e.g., via a p-well in the substrate) at the bottom of the memory hole (e.g., located below the SGS transistor). These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
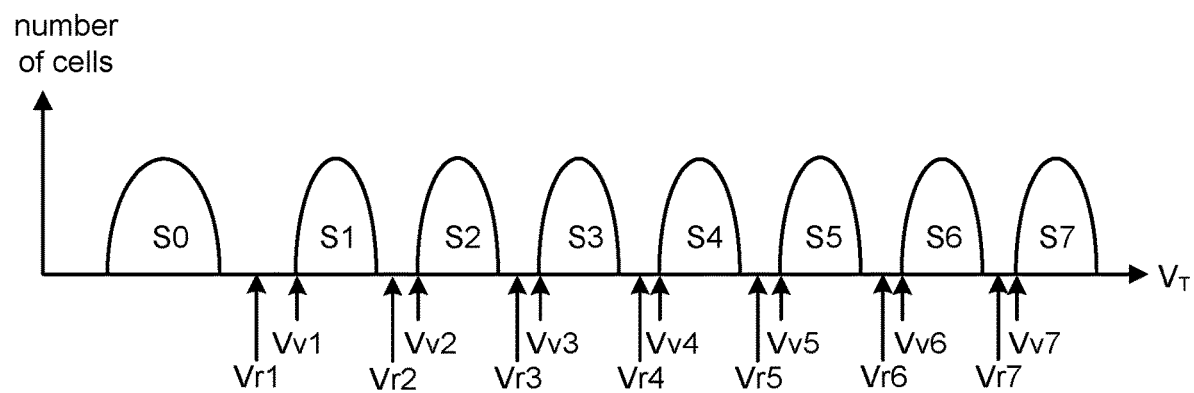
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
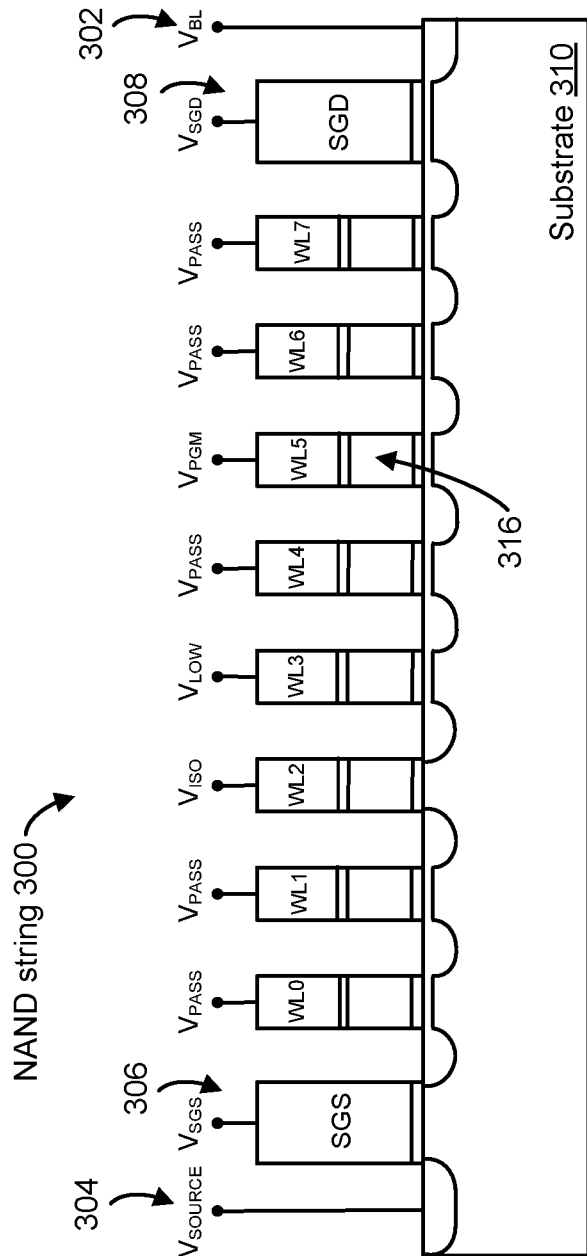
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 4A:
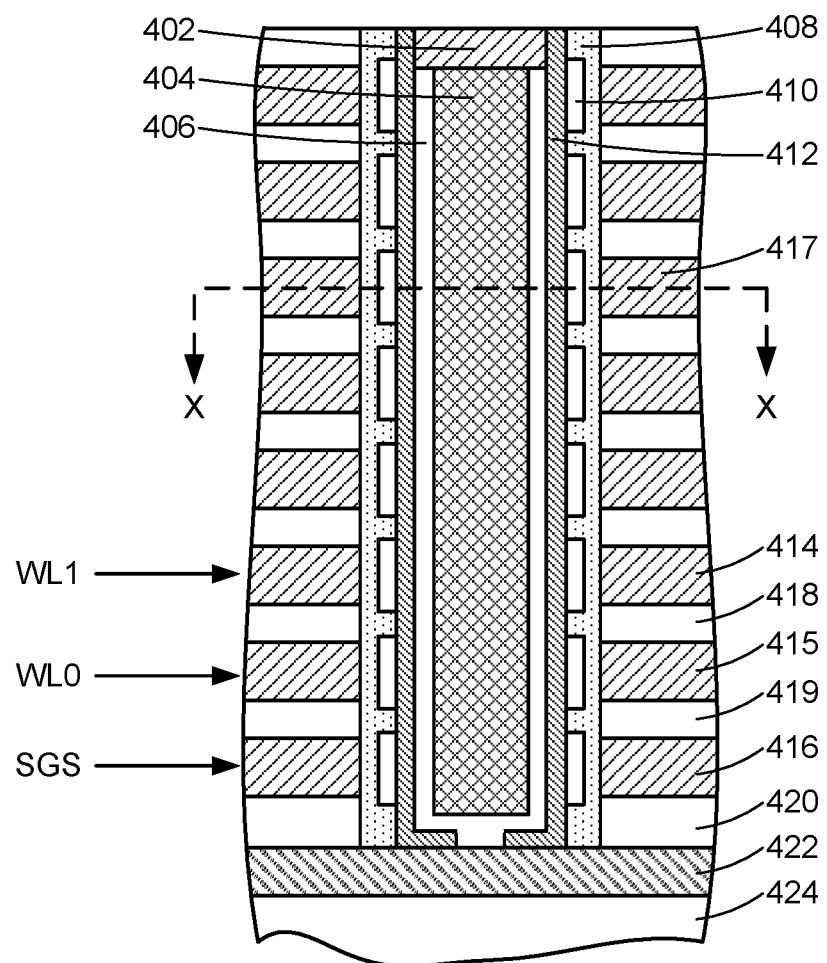
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
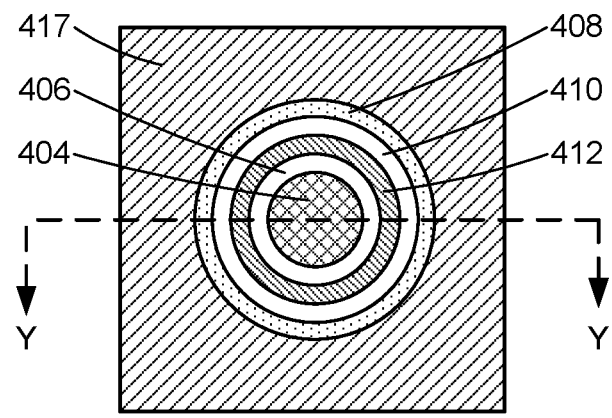
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure. More information regarding 3D NAND structures may be found in U.S. patent application Ser. No. 14/317,274, entitled "Three Dimensional NAND Device with Channel Contacting Conductive Source Line and Method of Making Thereof," filed Jun. 27, 2014.

Figure 5:
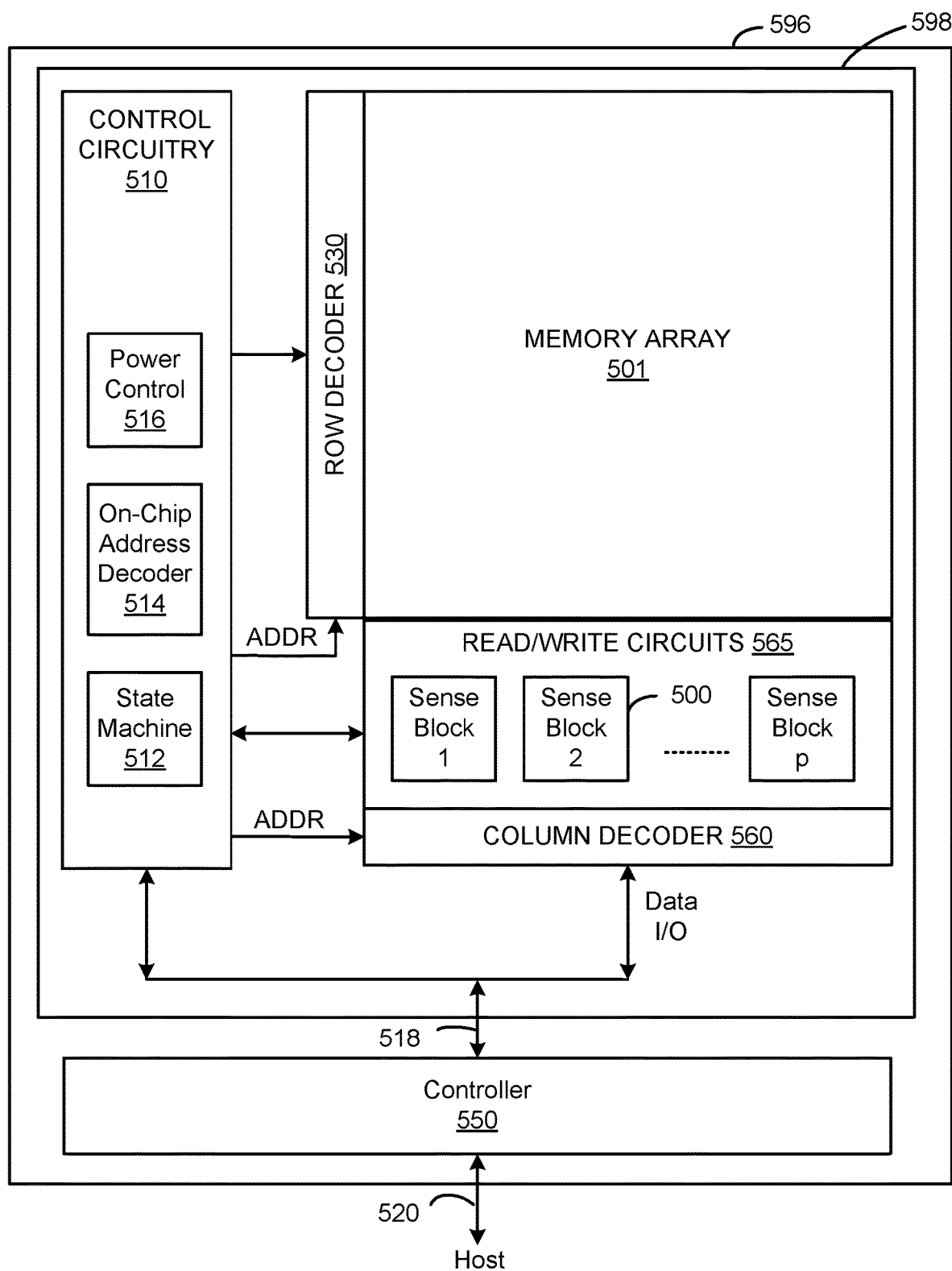
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
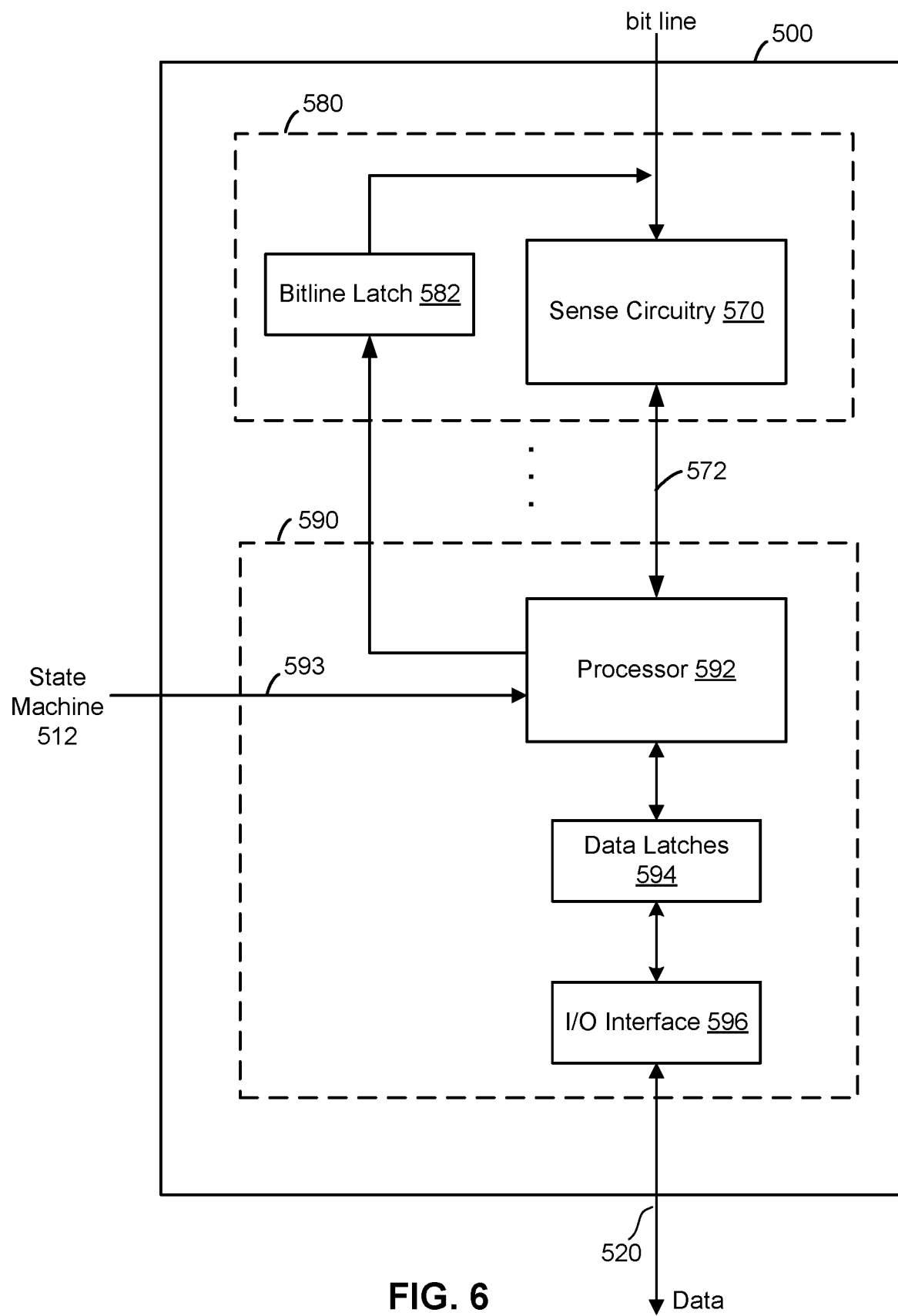
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
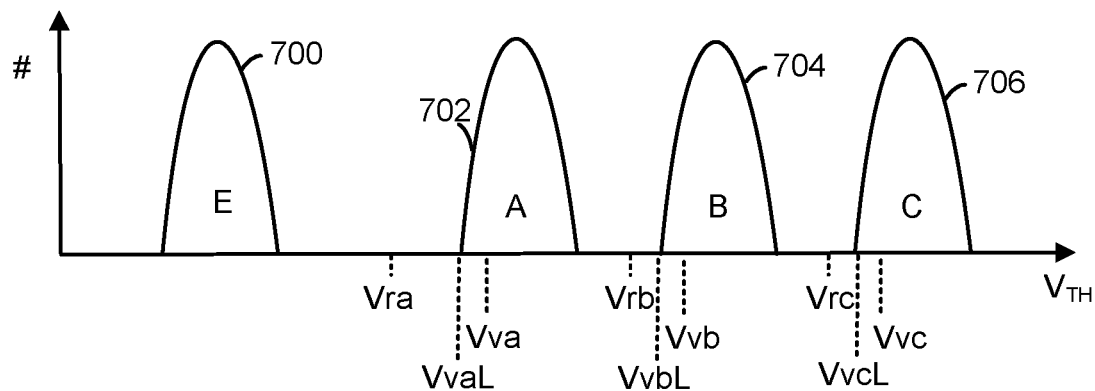
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
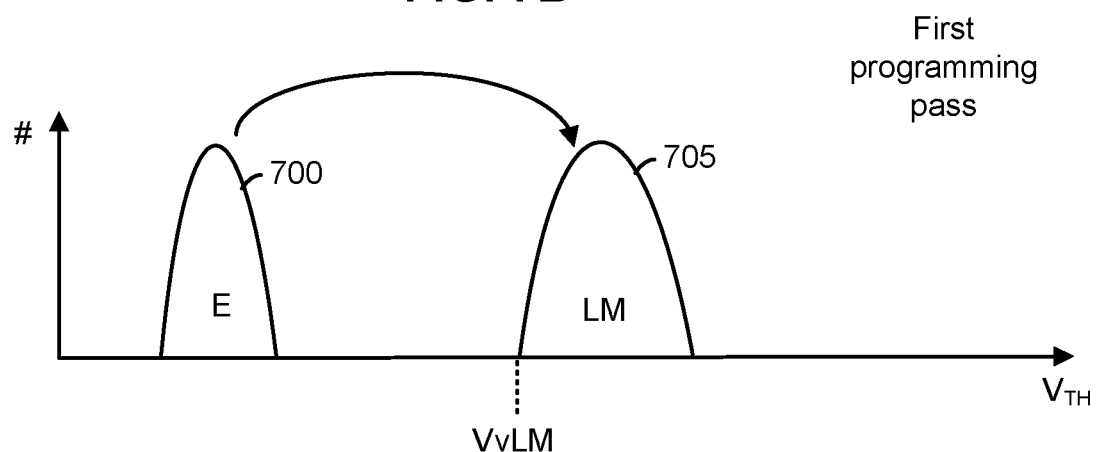
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

Figure 9A:
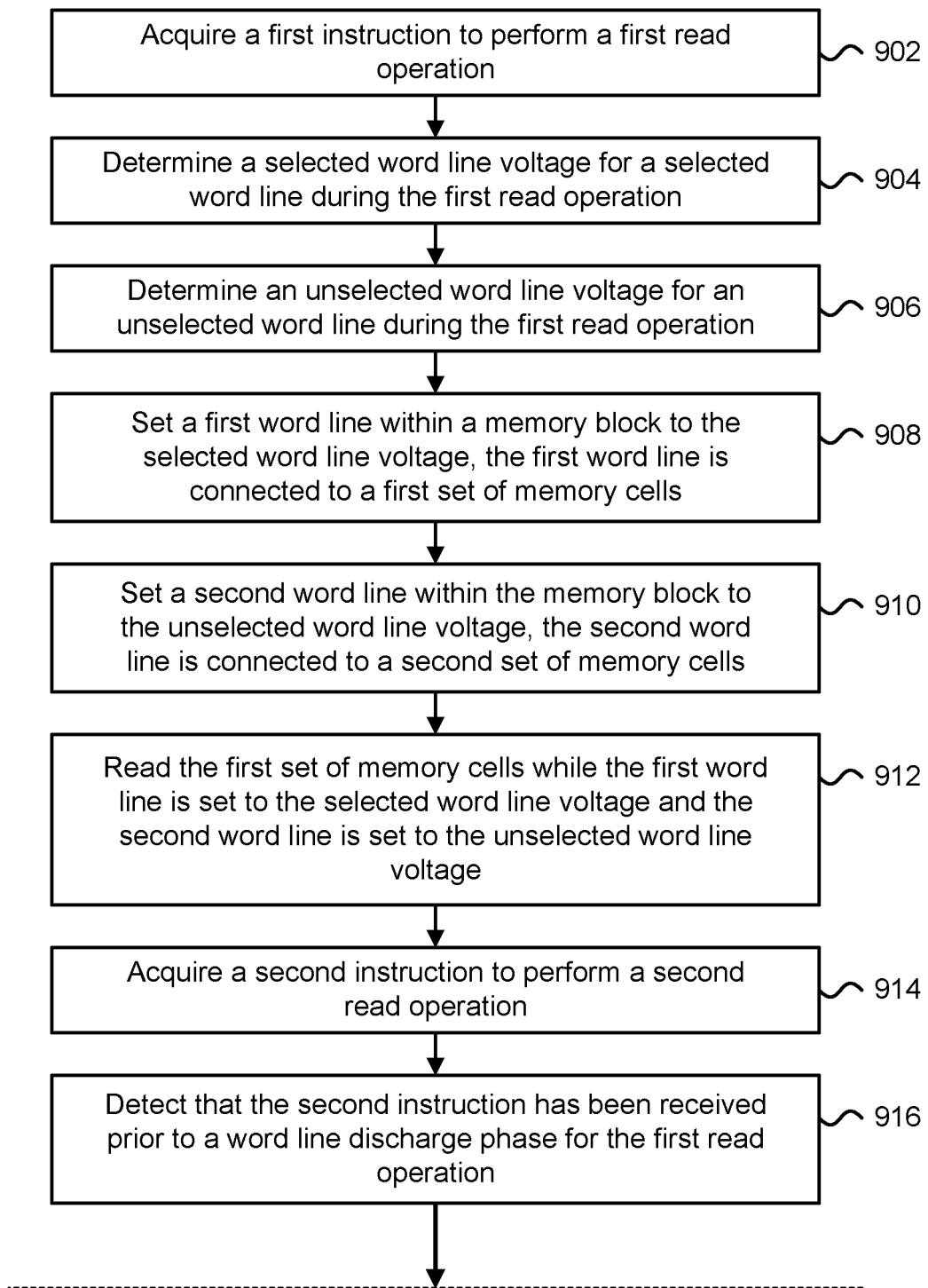
FIGS. 9A-9B depict a flowchart describing one embodiment of a process for performing consecutive read operations.

In one embodiment, after a storage element is programmed from the E-state to the LM-state, as indicated by step "1" in FIG. 9A, its neighbor storage element on an adjacent word line WLn+1 in the NAND string will then be programmed with respect to its lower page in a respective first programming pass of the adjacent word line, as indicated by step "2" in FIG. 9A.

Figure 7C:
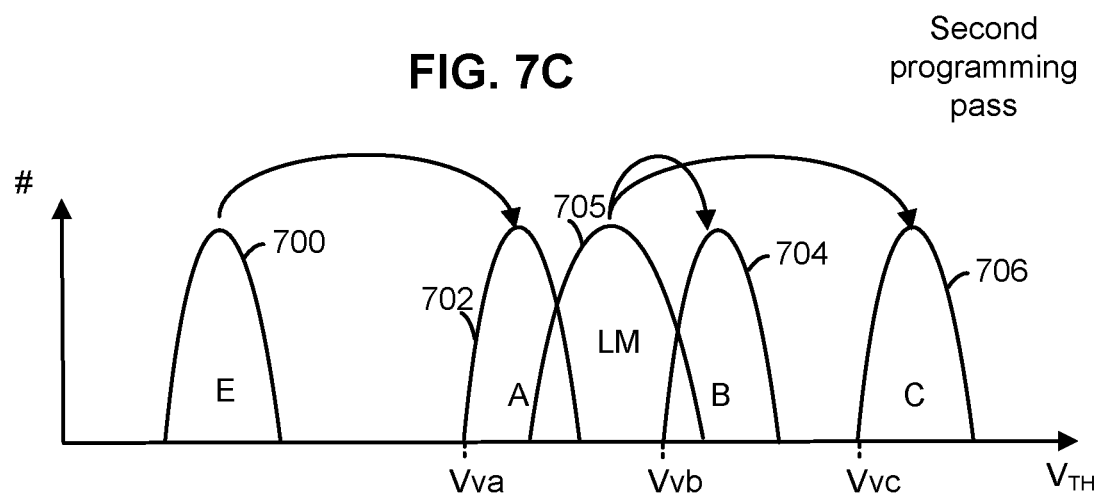
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 9A. The second pass of the two-pass programming technique for WLn+1 is indicated by step "5" in FIG. 9A.

Figure 7D:
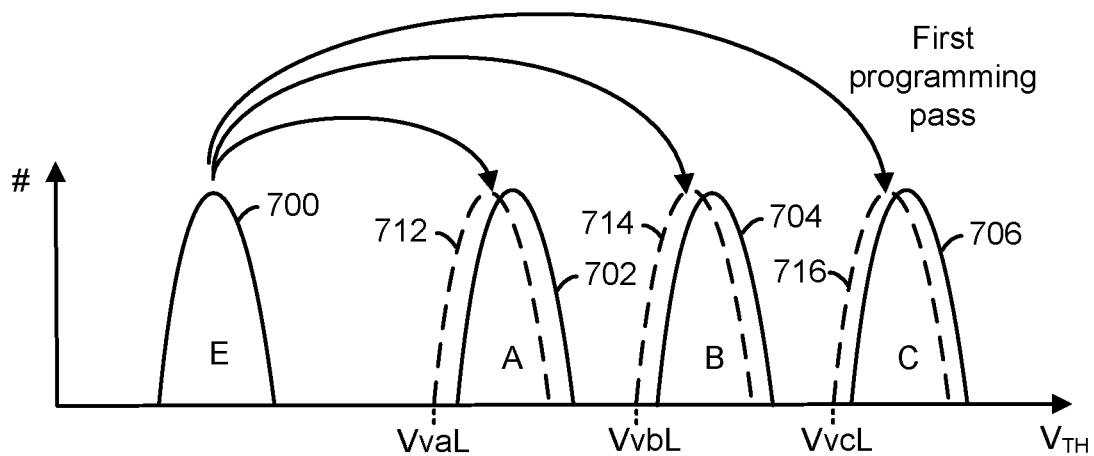
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
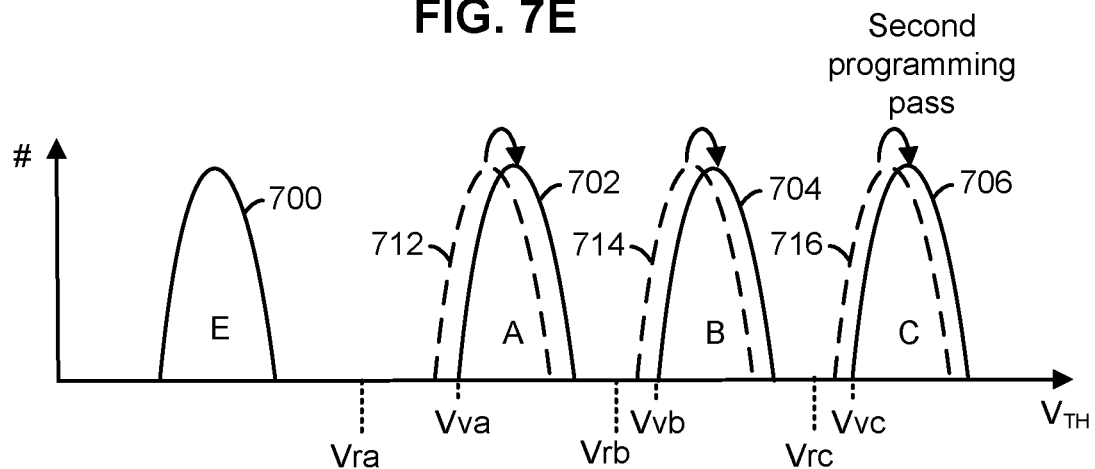
FIG. 7E depicts one embodiment of a second pass of the two-pass programming technique.
Figure 7F:
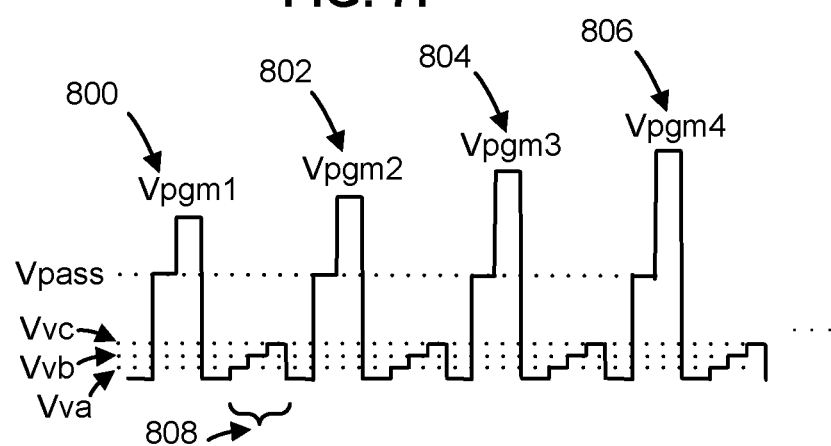
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively. One or more verify voltages 808, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 8A:
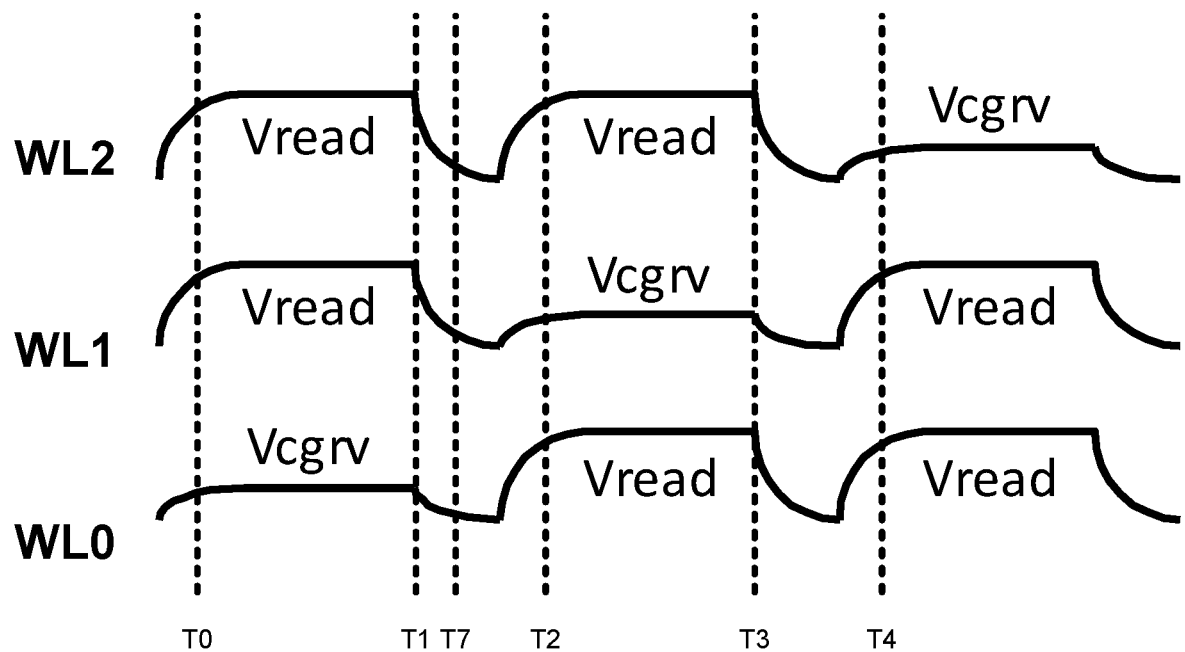
FIG. 8A depicts one embodiment of three voltage waveforms corresponding with the voltages applied to three different word lines within a memory block.

FIG. 8A depicts one embodiment of three voltage waveforms corresponding with the voltages applied to three different word lines within a memory block. The memory block may comprise a plurality of NAND strings, such as the NAND strings depicted in FIG. 3A. As depicted in FIG. 8A, during a first read operation between times T0 and T1 for reading a first set of memory cells connected to the word line WL0, the word line WL0 has been set to a selected word line voltage (e.g., Vcgrv or 2V) for sensing or determining the data states of the first set of memory cells, the word line WL1 has been set to an unselected word line voltage (e.g., Vread or 8V), and the word line WL2 has been set to the unselected word line voltage. Biasing the word lines WL1 and WL2 to the unselected word line voltage allows sensing currents through NAND strings to pass through the NAND strings and be controlled by the threshold voltages of the selected memory cell transistors connected to the selected word line WL0 during the first read operation.

Subsequent to the first read operation, the word lines WL2-WL0 are discharged and then charged to the appropriate word line voltages prior to performance of the second read operation. At time T1, the word line voltages applied to the word lines WL2-WL0 may be discharged towards ground or 0V or discharged to a voltage that is less than the selected word line voltage Vcgrv during the first read operation. In some cases, the amount of time required to discharge and then charge the word lines WL2-WL0 to the appropriate word line voltages for the second read operation may comprise several microseconds.

As depicted in FIG. 8A, during a second read operation between times T2 and T3 for reading a second set of memory cells connected to the word line WL1, the word line WL0 has been set to the unselected word line voltage (e.g., Vread or 8V), the word line WL1 has been set to the selected word line voltage (e.g., Vcgrv or 1.5V), and the word line WL2 has been set to the unselected word line voltage. Subsequent to the second read operation, the word lines WL2-WL0 are discharged and then charged to the appropriate word line voltages prior to a third read operation. During the third read operation that occur after time T4 for reading a third set of memory cells connected to the word line WL2, the word line WL0 has been set to the unselected word line voltage (e.g., Vread or 8V), the word line WL1 has been set to the unselected word line voltage, and the word line WL2 has been set to the selected word line voltage (e.g., Vcgrv or 1.5V).

Figure 8B:
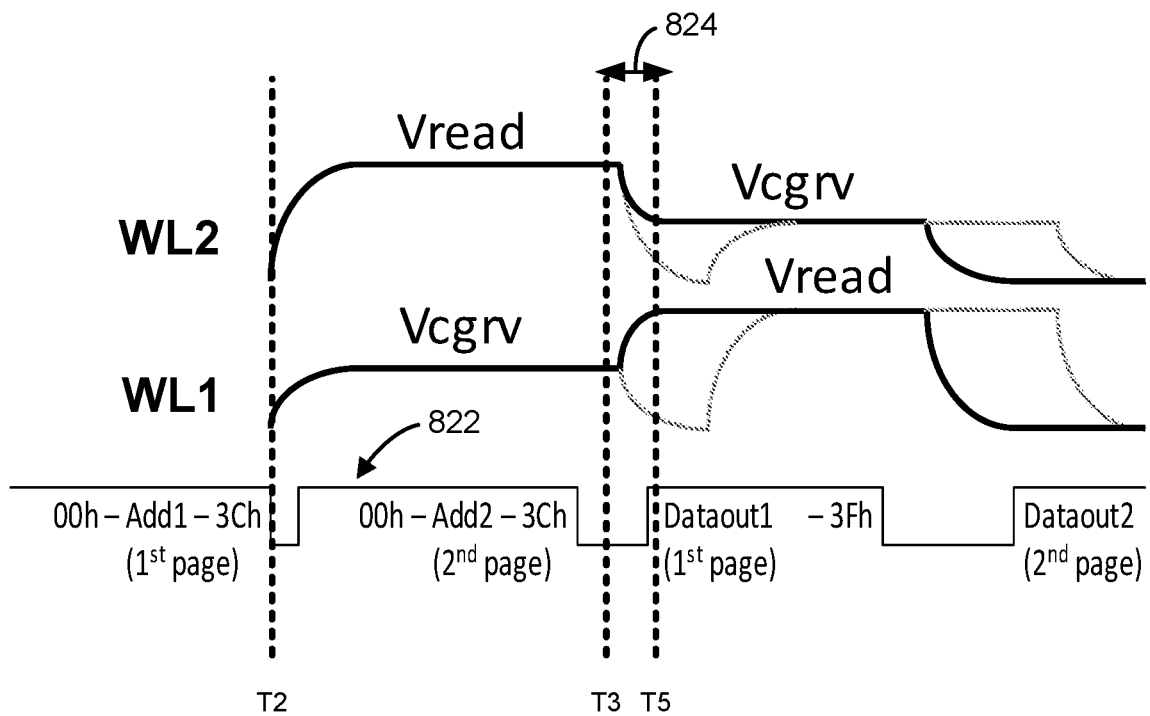
FIG. 8B depicts one embodiment of voltage waveforms corresponding with the word line voltages applied to two different word lines within a memory block during two consecutive read operations.

FIG. 8B depicts one embodiment of voltage waveforms corresponding with the word line voltages applied to two different word lines within a memory block during two consecutive read operations. As depicted, during a first read operation that is prior to time T3 and subsequent to time T2, the selected word line WL1 was biased to the selected word line voltage Vcgrv (e.g., 1.5V) and the unselected word line WL2 was biased to the unselected word line voltage Vread (e.g., 8V). At time T2, a controller received an instruction 822 to read a second page of data within the memory block. The controller may correspond with the control circuitry 510 in FIG. 5 or the controller 550 in FIG. 5. The instruction 822 may correspond with a read operation for a page address or a word line address that maps to memory cells connected to the word line WL2 within the memory block. As the instruction 822 was received prior to the word line discharge phase or prior to the discharging of the unselected word lines at time T3, the controller may skip the unselected word line discharge cycle, such as the discharging of unselected word lines that occurs at time T1 in FIG. 8A. Instead, the controller may cause the unselected word lines of the memory block not depicted to remain at the unselected word line voltage Vread, cause the next selected word line during the second read operation that begins at time T5 to transition from the unselected word line voltage Vread to the selected word line voltage Vcgrv, and cause the previously selected word line during the first read operation that ended at time T3 to transition from the selected word line voltage Vcgrv to the unselected word line voltage Vread. The period of time between times T3 and T5 may comprise a partial discharge period of time 824 during which the previously selected word line transitions from the selected word line voltage to the unselected word line voltage and one of the previously unselected word lines transitions from the unselected word line voltage to the selected word line voltage. The partial discharge period of time 824 may correspond with the period of time during which only one of the unselected word lines during the first read operation partially discharges from the unselected word line voltage Vread to the selected word line voltage Vcgrv while all the other unselected word lines remain at the unselected word line voltage Vread.

In one embodiment, the controller comprising one or more control circuits may detect that the unselected word line discharge cycle should be skipped in response to detecting that a subsequent read instruction for a page within the same memory block has been received prior to the initiation of the unselected word line discharge cycle. In another embodiment, the controller comprising one or more control circuits may detect that the unselected word line discharge cycle should be skipped in response to detecting that the subsequent read instruction for a page within a memory block has been received within a threshold period of time since the initiation of the unselected word line discharge cycle. In one example, although the unselected word line discharge cycle has been initiated, if the next or subsequent read instruction for the page within the memory block has been received within the threshold period of time since the initiation of the unselected word line discharge cycle (e.g., within 200 ns from the initiation of the unselected word line discharge cycle), then the controller may abort the unselected word line discharge cycle or prematurely end the unselected word line discharge cycle and cause the unselected word lines within the memory block to be biased to the unselected word line voltage Vread. In another example, in reference to FIG. 8A, although the unselected word line discharge cycle has been initiated at time T1, if the controller receives the subsequent read instruction prior to time T7, then the controller may cause the unselected word line discharge cycle to be terminated prematurely.

Figure 8C:
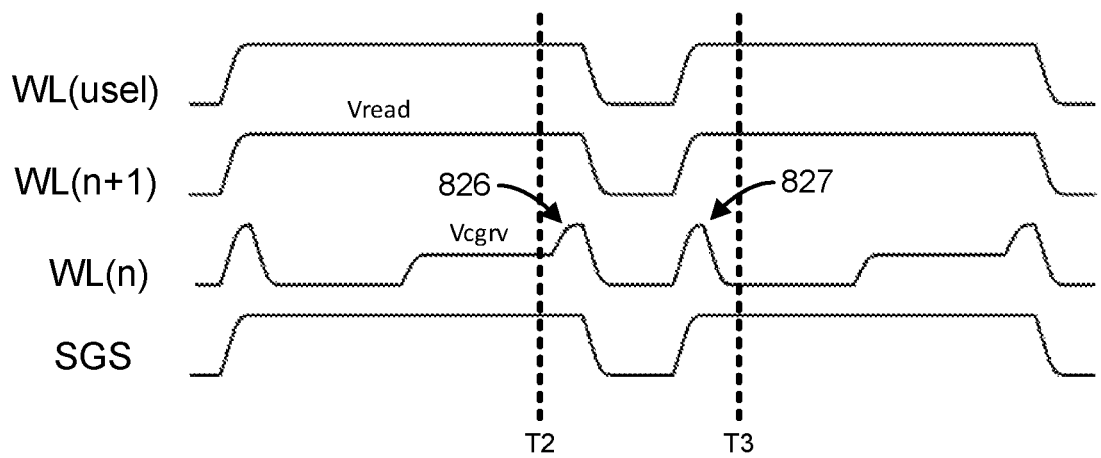
FIG. 8C depicts one embodiment of voltage waveforms corresponding with the word line voltages applied to different word lines within a memory block during consecutive read operations associated with the same word line.

FIG. 8C depicts one embodiment of voltage waveforms corresponding with the word line voltages applied to different word lines within a memory block during consecutive read operations associated with the same word line. As depicted, at time T2, a first read operation is performed in which the selected word line WL(n) has been biased to the selected word line voltage Vcgrv (e.g., 2.5V), the unselected word lines WL(n+1) and WL(usel) associated with the other word lines within the memory block have been biased to the unselected word line voltage Vread (e.g., 8V), and the source-side select gate line SGS that is connected to the gates of the source-side select transistors has been set to the unselected word line voltage or to a pass voltage (e.g., 4V). The source-side select gate line SGS may correspond with the source-side select gate line SGS depicted in FIG. 3A. In one example, the word line WL(n) may correspond with word line WL1 in FIG. 3A, the word line WL(n+1) may correspond with the word line WL2 in FIG. 3A, and the word lines WL(usel) may correspond with the word lines WL0 and WL3-WLY in FIG. 3A.

As depicted in FIG. 8C, between times T2 and T3 associated with the unselected word line discharge cycle, a Vread spike 826 applied to the selected word line WL(n) during the first read operation has occurred shortly after time T2 and an unselected word line charging phase that has caused coupling 827 into the selected word line WL(n) has occurred prior to time T3. At time T3, a second read operation may be performed in which the selected word line WL(n) has been biased to the selected word line voltage Vcgrv and the unselected word lines WL(n+1) and WL(usel) have been biased to the unselected word line voltage Vread. In this case, a first page of data associated with a first set of memory cells connected to word line WL(n) may be read during the first read operation and a second page of data associated with a second set of memory cells connected to word line WL(n) may be read during the second read operation. The first set of memory cells may be connected to a first set of bit lines and the second set of memory cells may be connected to a second set of bit lines different from the first set of bit lines.

Figure 8D:
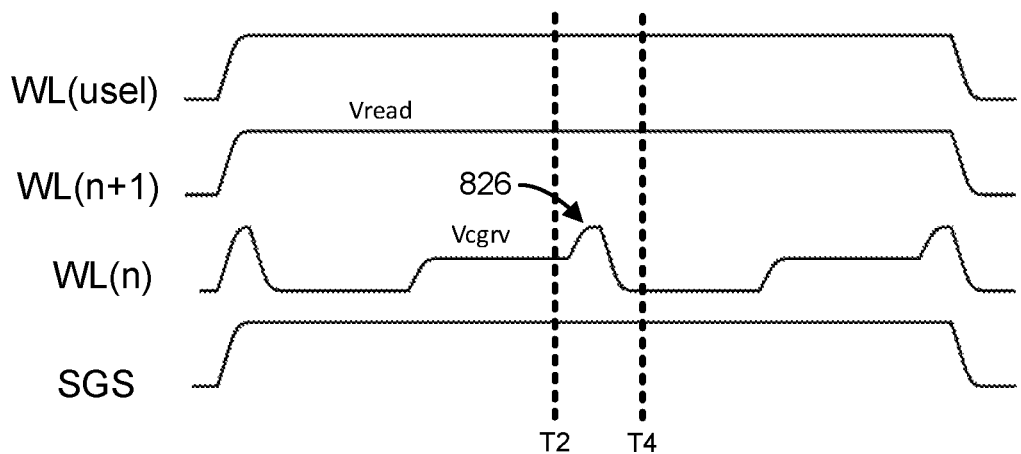
FIG. 8D depicts another embodiment of voltage waveforms corresponding with the word line voltages applied to different word lines within a memory block during consecutive read operations associated with the same word line.

FIG. 8D depicts another embodiment of voltage waveforms corresponding with the word line voltages applied to different word lines within a memory block during consecutive read operations associated with the same word line. As depicted, rather than performing the unselected word line discharge cycle between the times T2 and T3 depicted in FIG. 8C, a Vread spike 826 has been applied subsequent to time T2, the unselected word lines WL(n+1) and WL(usel) have remained at the unselected word line voltage Vread, and the selected word line WL(n) has been biased to a sensing voltage less than the selected word line voltage by time T4. In this case, the unselected word line discharge cycle has been skipped and the voltages applied to the only selected word line WL(n) used during the two consecutive read operations has been adjusted between times T2 and T4.

Figure 8E:
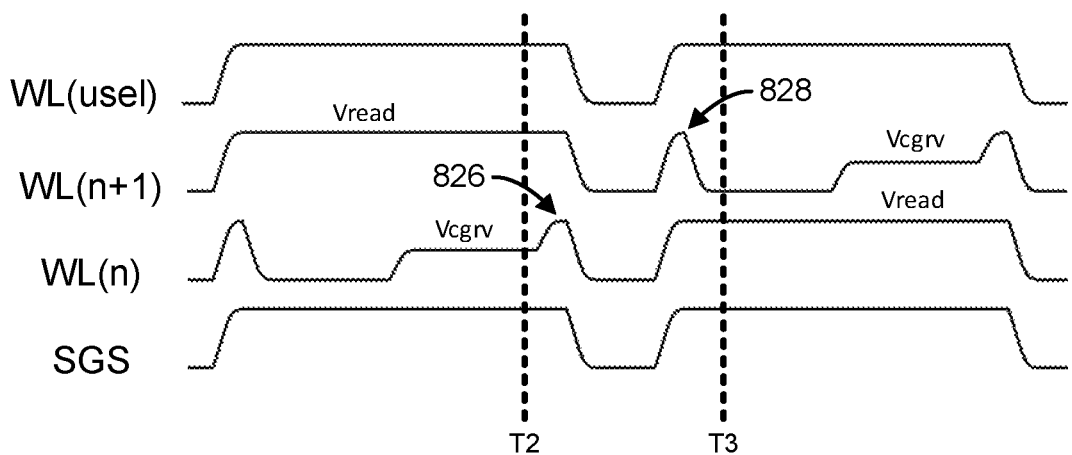
FIG. 8E depicts one embodiment of voltage waveforms corresponding with the word line voltages applied to different word lines within a memory block during consecutive read operations associated with different word lines within the memory block.

FIG. 8E depicts one embodiment of voltage waveforms corresponding with the word line voltages applied to different word lines within a memory block during consecutive read operations associated with different word lines within the memory block. As depicted, at time T2, a first read operation is performed in which the selected word line WL(n) has been biased to the selected word line voltage Vcgrv (e.g., 2.5V), the unselected word lines WL(n+1) and WL(usel) associated with the other word lines within the memory block have been biased to the unselected word line voltage Vread (e.g., 8V), and the source-side select gate line SGS that is connected to the control gates of the source-side select transistors has been set to the unselected word line voltage.

Between times T2 and T3 associated with the unselected word line discharge cycle, a Vread spike 826 supplied to the selected word line has occurred shortly after time T2 and an unselected word line charging phase that has caused coupling 828 into the selected word line WL(n+1) for the second read operation has occurred prior to time T3. The coupling 828 has occurred on the word line WL(n+1) as the second read operation will be performed on memory cells connected to the word line WL(n+1) during the second read operation. At time T3, a second read operation may be performed in which the next selected word line WL(n+1) has been biased to the selected word line voltage and the unselected word lines WL(n) and WL(usel) during the second read operation have been biased to the unselected word line voltage Vread. In this case, a first page of data associated with a first set of memory cells connected to word line WL(n) may be read during the first read operation and a second page of data associated with a second set of memory cells connected to word line WL(n+1) may be read during the second read operation.

In one embodiment, a controller may receive the instruction to read the second page of data after the unselected word line discharge cycle has already been initiated or after a threshold period of time (e.g., more than 200 ns have passed) has passed since the unselected word line discharge cycle was initiated. If the instruction to read the second page of data was received by the controller after the threshold period of time since the unselected word line discharge cycle was initiated (e.g., more than 200 ns after time T2), then the entire unselected word line discharge cycle may be performed. In this situation, voltage waveforms similar to those depicted in FIG. 8E may be applied to the word lines of the memory block, rather than voltage waveforms similar to those depicted in FIG. 8F.

Figure 8F:
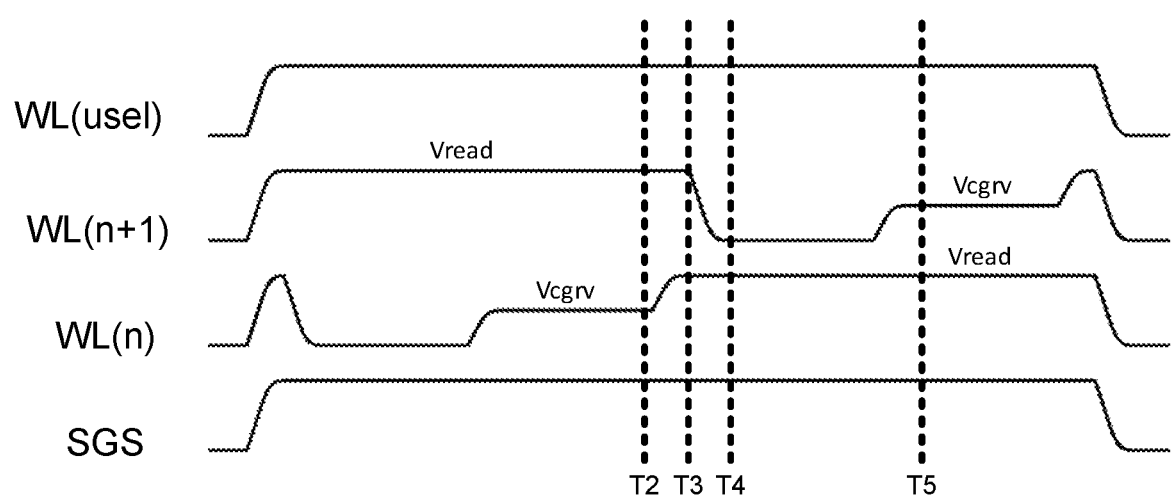
FIG. 8F depicts another embodiment of voltage waveforms corresponding with the word line voltages applied to different word lines of the memory block during consecutive read operations associated with different word lines within the memory block.

FIG. 8F depicts another embodiment of voltage waveforms corresponding with the word line voltages applied to different word lines of the memory block during consecutive read operations associated with different word lines within the memory block. As depicted, at time T2, a first read operation is performed in which the selected word line WL(n) has been biased to the selected word line voltage Vcgrv, the unselected word lines WL(n+1) and WL(usel) associated with the other word lines within the memory block have been biased to the unselected word line voltage Vread, and the source-side select gate line SGS that is connected to the control gates of the source-side select transistors has been set to the unselected word line voltage or to a pass voltage.

In one embodiment, the controller comprising one or more control circuits may receive an instruction to read a second page associated with the word line WL(n+1) prior to the end of the first read operation at time T2 and determine that the unselected word line discharge cycle should be skipped. At time T2, the word line WL(n) that comprises the selected word line during the first read operation transitions from the selected word line voltage Vcgrv to the unselected word line voltage Vread. At time T3, the word line WL(n+1) that comprises the next selected word line that will be selected during the second read operation transitions from the unselected word line voltage Vread to an initial voltage for the second read operation. The initial voltage may comprise 0V or a voltage less than the selected word line voltage Vcgrv during a read operation. At time T4, the word line voltages for the second read operation have been applied to the word lines within the memory block and the second read operation may be performed.

In another embodiment, a controller comprising one or more control circuits may determine the amount of partial discharge time between times T2 and T4 during which the memory block transitions from performing the first read operation to performing the second read operation. The partial discharge period of time between times T2 and T4 may be determined based on the selected word line voltage used during the first read operation (e.g., the highest voltage applied to the selected word line during the first read operation), the unselected word line voltage used during the first read operation, or the difference between the selected word line voltage and the unselected word line voltage. In one example, if the difference between the selected word line voltage and the unselected word line voltage is greater than 4V, then the partial discharge period of time may be set to 400 ns; however, if the difference between the selected word line voltage and the unselected word line voltage is not greater than 4V, then the partial discharge period of time may be set to 200 ns. In another example, if the unselected word line voltage is greater than 7V, then the partial discharge period of time may be set to 500 ns; however, if the unselected word line voltage is not greater than 7 V, then the partial discharge period of time may be set to 250 ns. After the partial discharge period of time has passed since the end of the first read operation, then the controller may initiate the second read operation to read memory cells connected to the next selected word line, such as the word line WL(n+1) in FIG. 8F after time T4.

Figure 9B:
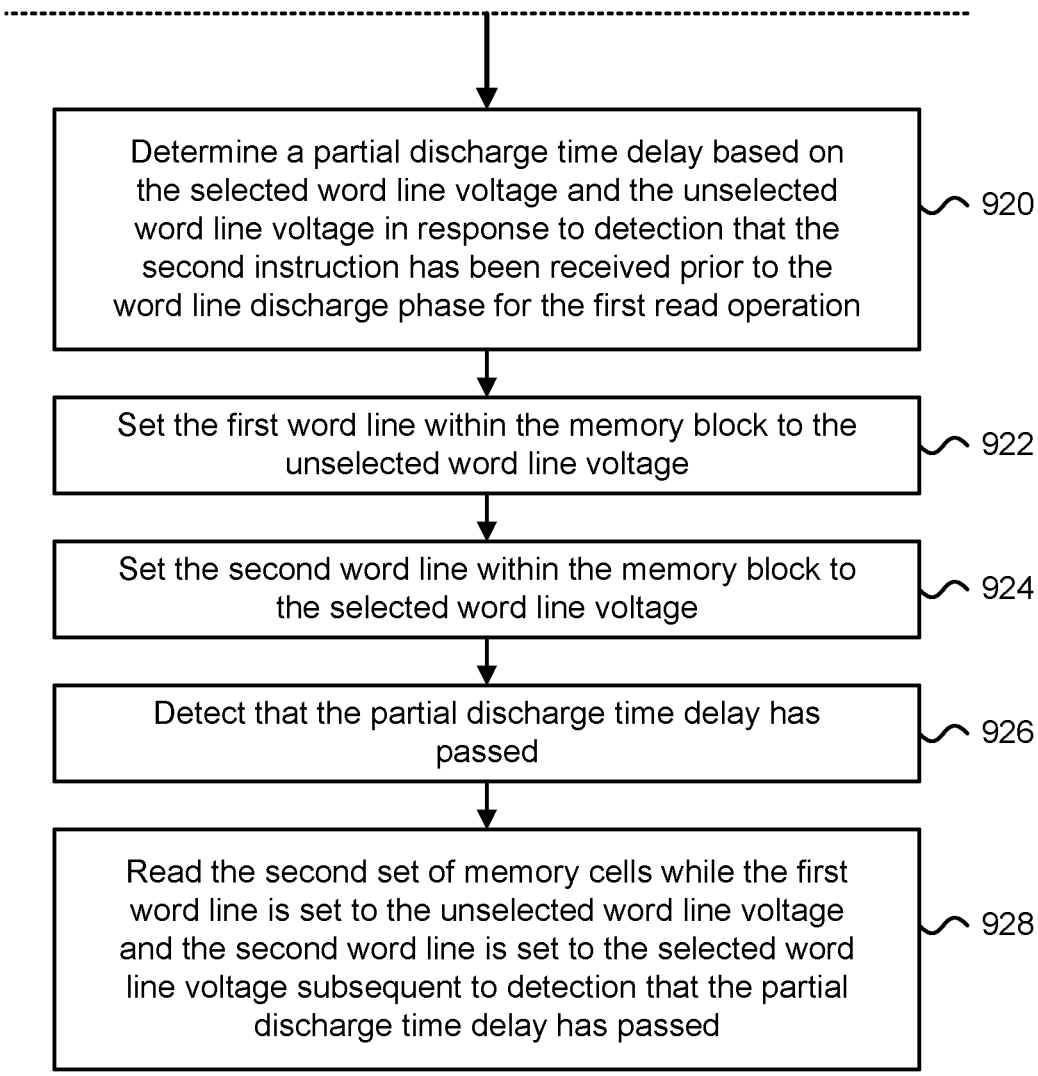

FIGS. 9A-9B depict a flowchart describing one embodiment of a process for performing consecutive read operations. In one embodiment, the process of FIGS. 9A-9B may be performed by a non-volatile storage system, such as the non-volatile storage system 596 in FIG. 5. In another embodiment, the process of FIGS. 9A-9B may be performed by control circuitry, such as the control circuitry 510 in FIG. 5.

In step 902, a first instruction to perform a first read operation is acquired. The first instruction may comprise a read command for reading a first page of data from a first set of memory cells connected to a first word line within a memory block. Each memory cell of the first set of memory cells may correspond with a floating gate transistor or a charge trap transistor. The memory block may comprise a plurality of NAND strings, such as the NAND strings depicted in FIG. 3A. In step 904, a selected word line voltage for a selected word line during the first read operation is determined. In one example, the selected word line voltage for the selected word line during the first read operation may be determined via a lookup table stored in non-volatile memory. The selected word line voltage may correspond with the control gate voltage that is applied to the selected word line during a read operation, such as the selected word line voltage Vcgrv applied to the selected word line WL1 in FIG. 8B between times T2 and T3.

In step 906, an unselected word line voltage for an unselected word line during the first read operation is determined. The unselected word line voltage may be applied to memory cell transistors on the drain-side of a selected memory cell transistor and on the source-side of the selected memory cell transistor such that the conduction of a NAND string that includes the selected memory cell transistor depends on the selected word line voltage applied to the selected word line that is connected to the control gate of the selected memory cell transistor. The unselected word line voltage may correspond with the control gate voltage that is applied to the unselected word line during the read operation, such as the unselected word line voltage Vread applied to the unselected word line WL2 in FIG. 8B between times T2 and T3.

In step 908, a first word line within a memory block is set to the selected word line voltage. The first word line may comprise the selected word line during the first read operation. The first word line may be connected to a first set of memory cells within the memory block. In step 910, a second word line within the memory block is set to the unselected word line voltage. The second word line may comprise an unselected word line during the first read operation. The second word line may be connected to a second set of memory cells within the memory block. In step 912, the first set of memory cells is read while the first word line is set to the selected word line voltage and the second word line is set to the unselected word line voltage.

In step 914, a second instruction to perform a second read operation subsequent to the first read operation is acquired. The second instruction may comprise a second read command for reading a second page of data from a second set of memory cells connected to a second word line different from the first word line within the memory block. The identification of the selected word line may be determined based on a block address, a page address, and/or a word line address associated with the second instruction to perform the second read operation. In step 916, it is detected that the second instruction has been received prior to a word line discharge phase for the first read operation. The word line discharge phase may comprise a time period during which unselected word lines are discharged and then charged between consecutive read operations. The word line discharge phase may correspond with the time period between times T2 and T3 in FIG. 8E. In one example, the second instruction to perform the second read operation may correspond with the instruction 822 in FIG. 8B that is received prior to the initiation of the word line discharge phase or the unselected word line discharge phase that begins at time T3 in FIG. 8B.

In step 920, a partial discharge time delay is determined based on the selected word line voltage and the unselected word line voltage in response to detection that the second instruction has been received prior to the word line discharge phase for the first read operation. In step 922, the first word line within the memory block is set to the unselected word line voltage. The unselected word line voltage may correspond with the unselected word line voltage Vread depicted in FIG. 8F at time T5 and the selected word line voltage may correspond with the selected word line voltage Vcgrv depicted in FIG. 8F at time T5. In one example, the unselected word line voltage may comprise 6V or 8V and the selected word line voltage may comprise 1.5V or 3V. In step 924, the second word line within the memory block is set to the selected word line voltage. In some cases, the first word line within the memory block may be set to the unselected word line voltage prior to the second word line within the memory block being set to the selected word line voltage, such as the word line WL(n) in FIG. 8F that has been set to the unselected word line voltage Vread at time T3 prior to the word line WL(n+1) being set or discharged to an initial voltage for the second read operation prior to time T4.

In step 926, it is detected that the partial discharge time delay has passed. The partial discharge time delay may be set based on the selected word line voltage, the unselected word line voltage, and/or a difference between the selected word line voltage and the unselected word line voltage. In one example, if the difference between the selected word line voltage and the unselected word line voltage is greater than 5V, then the partial discharge time delay may be set to 500 ns; however, if the difference between the selected word line voltage and the unselected word line voltage is not greater than 5 V, then the partial discharge time delay may be set to 250 ns. In step 928, the second set of memory cells is read while the first word line is set to the unselected word line voltage and the second word line is set to the selected word line voltage subsequent to or in response to detection that the partial discharge time delay has passed since the end of the first read operation.

One embodiment of the disclosed technology includes a memory array including a first set of memory cell transistors and a second set of memory cell transistors, a first word line connected to the first set of memory cell transistors, a second word line connected to the second set of memory cell transistors, and one or more control circuits in communication with the first word line and the second word line. The one or more control circuits configured to acquire a first instruction to read the first set of memory cell transistors during a first read operation. The one or more control circuits configured to set the first word line to a selected word line voltage during the first read operation and set the second word line to an unselected word line voltage during the first read operation. The one or more control circuits configured to read the first set of memory cell transistors while the first word line is set to the selected word line voltage and the second word line is set to the unselected word line voltage. The one or more control circuits configured to acquire a second instruction to read the second set of memory cell transistors during a second read operation and determine a partial discharge time delay based on the selected word line voltage. The one or more control circuits configured to set the first word line to the unselected word line voltage during the second read operation and set the second word line to the selected word line voltage during the second read operation. The one or more control circuits configured to detect that the partial discharge time delay has passed since the first word line began the transition to the unselected word line voltage from the selected word line voltage and read the second set of memory cell transistors while the first word line is set to the unselected word line voltage and the second word line is set to the selected word line voltage in response to detection that the partial discharge time delay has passed.

One embodiment of the disclosed technology includes acquiring a first instruction to read a first set of data from the memory block during a first read operation. The memory block includes a first word line connected to a first set of memory cell transistors and a second word line connected to a second set of memory cell transistors. The method further comprises determining a selected word line voltage for the first word line during the first read operation, determining an unselected word line voltage for the second word line during the first read operation, setting the first word line to the selected word line voltage, setting the second word line to the unselected word line voltage, reading the first set of memory cell transistors while the first word line is set to the selected word line voltage and the second word line is set to the unselected word line voltage, acquiring a second instruction to read a second set of data from the memory block during a second read operation, determining a partial discharge time delay based on the selected word line voltage, setting the first word line to the unselected word line voltage, setting the second word line to the selected word line voltage, detecting that the partial discharge time delay has passed since initiating the setting of the first word line to the unselected word line voltage, and reading the second set of memory cell transistors while the first word line is set to the unselected word line voltage and the second word line is set to the selected word line voltage in response to detection that the partial discharge time delay has passed.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
   a memory array including a first set of memory cell transistors and a second set of memory cell transistors;
   a first word line connected to the first set of memory cell transistors;
   a second word line connected to the second set of memory cell transistors; and
   one or more control circuits in communication with the first word line and the second word line, the one or more control circuits configured to read the first set of memory cell transistors while the first word line is set to a selected word line voltage and the second word line is set to an unselected word line voltage, the one or more control circuits configured to acquire a second instruction to read the second set of memory cell transistors and determine a partial discharge time delay based on the selected word line voltage subsequent to acquiring the second read instruction, the one or more control circuits configured to detect that the partial discharge time delay has passed since the first word line began the transition to the unselected word line voltage from the selected word line voltage and read the second set of memory cell transistors while the first word line is set to the unselected word line voltage and the second word line is set to the selected word line voltage in response to detection that the partial discharge time delay has passed.

2. The non-volatile storage system of claim 1, wherein:
   the one or more control circuits configured to detect that at least the partial discharge time delay has passed since an initiation of the transition of the first word line from the selected word line voltage to the unselected word line voltage.

3. The non-volatile storage system of claim 1, wherein:
   the one or more control circuits configured to determine the partial discharge time delay based on the selected word line voltage and the unselected word line voltage.

4. The non-volatile storage system of claim 1, wherein:
   the one or more control circuits configured to determine the partial discharge time delay based on a voltage difference between the selected word line voltage and the unselected word line voltage.

5. The non-volatile storage system of claim 1, wherein:
   the one or more control circuits configured to detect that the second instruction was received prior to discharge of the first word line from the unselected word line voltage and determine the partial discharge time delay in response to detection that the second instruction was received prior to the discharge of the first word line from the unselected word line voltage.

6. The non-volatile storage system of claim 1, wherein:
   the one or more control circuits configured to detect that the second instruction was received within a threshold period of time from an initiation of a discharging of the second word line from the unselected word line voltage and determine the partial discharge time delay in response to detection that the second instruction was received within the threshold period of time from the initiation of the discharging of the second word line from the unselected word line voltage.

7. The non-volatile storage system of claim 1, wherein:
   the unselected word line voltage is greater than the selected word line voltage.

8. The non-volatile storage system of claim 1, wherein:
   the first set of memory cell transistors comprises floating gate transistors.

9. A method for reading data from a memory block, comprising:
   acquiring a first instruction to read a first set of data from the memory block during a first read operation, the memory block includes a first word line connected to a first set of memory cell transistors and a second word line connected to a second set of memory cell transistors;
   determining a selected word line voltage for the first word line during the first read operation;
   determining an unselected word line voltage for the second word line during the first read operation;
   setting the first word line to the selected word line voltage;
   setting the second word line to the unselected word line voltage;
   reading the first set of memory cell transistors while the first word line is set to the selected word line voltage and the second word line is set to the unselected word line voltage;

acquiring a second instruction to read a second set of data from the memory block during a second read operation;

determining a partial discharge time delay based on the selected word line voltage;

setting the first word line to the unselected word line voltage;

setting the second word line to the selected word line voltage;

detecting that the partial discharge time delay has passed since initiating the setting of the first word line to the unselected word line voltage; and reading the second set of memory cell transistors while the first word line is set to the unselected word line voltage and the second word line is set to the selected word line voltage in response to detection that the partial discharge time delay has passed.

10. The method of claim 9, wherein:
the detecting that the partial discharge time delay has passed includes detecting that at least the partial discharge time delay has passed since the initiation of the voltage transition of the first word line from the selected word line voltage to the unselected word line voltage.

11. The method of claim 9, wherein:
the determining the partial discharge time delay includes determining the partial discharge time delay based on the selected word line voltage and the unselected word line voltage.

12. The method of claim 9, wherein:
the determining the partial discharge time delay includes determining the partial discharge time delay based on a voltage difference between the selected word line voltage and the unselected word line voltage.

13. The method of claim 9, further comprising:
detecting that the second instruction was received prior to discharging of the first word line from the unselected word line voltage and determining the partial discharge time delay in response to detection that the second instruction has been received prior to the discharging of the first word line from the unselected word line voltage.

14. The method of claim 9, further comprising:
detecting that the second instruction was received within a threshold period of time from an initiation of discharging of the second word line from the unselected word line voltage and determining the partial discharge time delay in response to detection that the second instruction was received within the threshold period of time from the initiation of the discharging of the second word line from the unselected word line voltage.

15. The method of claim 9, further comprising:
detecting that the first set of data and the second set of data are stored within the memory block based on the first instruction and the second instruction.

16. The method of claim 9, wherein:
the partial discharge time delay corresponds with an amount of time required to transition the first word line from the selected word line voltage to the unselected word line voltage and transition the second word line from the unselected word line voltage to the selected word line voltage.

17. The method of claim 9, wherein:
the unselected word line voltage is greater than the selected word line voltage.

18. The method of claim 9, wherein:
the first set of memory cell transistors comprises floating gate transistors.

19. An apparatus, comprising:
a memory block including a first set of floating gate transistors and a second set of floating gate transistors;

a first word line connected to the first set of floating gate transistors;

a second word line connected to the second set of floating gate transistors; and one or more control circuits in communication with the first word line and the second word line, the one or more control circuits configured to acquire a first instruction to perform a first read operation for the first set of floating gate transistors, the one or more control circuits configured to set the first word line to a selected word line voltage during the first read operation and set the second word line to an unselected word line voltage during the first read operation, the one or more control circuits configured to read the first set of floating gate transistors while the first word line is set to the selected word line voltage and the second word line is set to the unselected word line voltage, the one or more control circuits configured to acquire a second instruction to perform a second read operation for the second set of floating gate transistors and determine a partial discharge time delay based on a voltage difference between the selected word line voltage and the unselected word line voltage, the one or more control circuits configured to set the first word line to the unselected word line voltage during the second read operation and set the second word line to the selected word line voltage during the second read operation, the one or more control circuits configured to detect that the partial discharge time delay has passed since the first word line began the transition to the unselected word line voltage from the selected word line voltage and read the second set of memory cell transistors while the first word line is set to the unselected word line voltage and the second word line is set to the selected word line voltage in response to detection that the partial discharge time delay has passed.

20. The apparatus of claim 19, wherein:
the one or more control circuits configured to detect that the second instruction was received prior to discharge of the first word line from the unselected word line voltage and determine the partial discharge time delay in response to detection that the second instruction was received prior to the discharge of the first word line from the unselected word line voltage.

* * * * *